(12) United States Patent
Qian et al.

(10) Patent No.: US 8,148,685 B2
(45) Date of Patent: Apr. 3, 2012

(54) TRANSMISSION ELECTRON MICROSCOPE MICRO-GRID

(75) Inventors: Li Qian, Beijing (CN); Li Fan, Beijing (CN); Liang Liu, Beijing (CN); Chen Feng, Beijing (CN); Yu-Quan Wang, Beijing (CN)

(73) Assignee: Beijing FUNATE Innovation Technology Co., Ltd., Beijing (CN)

( * ) Notice: Subject to any disclaimer, the term of this patent is extended or adjusted under 35 U.S.C. 154(b) by 83 days.

(21) Appl. No.: 12/848,315

(22) Filed: Aug. 2, 2010

(65) Prior Publication Data

US 2011/0192987 A1 Aug. 11, 2011

(30) Foreign Application Priority Data

Feb. 8, 2010 (CN) .......................... 2010 1 0106701

(51) Int. Cl.
*H01J 37/26* (2006.01)
*H01J 1/30* (2006.01)
(52) U.S. Cl. ............... 250/311; 250/440.11; 977/742; 977/932; 977/745; 313/309; 313/336; 313/351; 252/502
(58) Field of Classification Search .............. 250/311, 250/440.11; 313/309, 336, 351; 977/742, 977/932, 745; 252/502
See application file for complete search history.

(56) References Cited

U.S. PATENT DOCUMENTS

| 7,045,108 | B2 | 5/2006 | Jiang et al. | |
| 7,105,596 | B2* | 9/2006 | Smalley et al. | 524/495 |
| 7,148,619 | B2* | 12/2006 | Den et al. | 313/495 |
| 7,453,193 | B2* | 11/2008 | Den et al. | 313/309 |
| 7,641,885 | B2* | 1/2010 | Liu et al. | 423/447.3 |
| 2007/0166223 | A1 | 7/2007 | Jiang et al. | |
| 2008/0237464 | A1* | 10/2008 | Zhang et al. | 250/311 |
| 2008/0248235 | A1 | 10/2008 | Feng et al. | |
| 2008/0299031 | A1 | 12/2008 | Liu et al. | |
| 2009/0317926 | A1 | 12/2009 | Zhang et al. | |

FOREIGN PATENT DOCUMENTS

| CN | 101276724 A | 10/2008 |
| CN | 101609771 | 12/2009 |
| JP | P2006-244742 A | 9/2006 |
| WO | WO2007015710 | 2/2007 |

* cited by examiner

*Primary Examiner* — Nikita Wells
(74) *Attorney, Agent, or Firm* — Altis Law Group, Inc.

(57) ABSTRACT

A transmission electron microscope (TEM) micro-grid includes a base and a plurality of electron transmission portions. The base includes a plurality of first carbon nanotubes and the first carbon nanotubes have a first density. Each electron transmission portions includes a hole defined in the base and a plurality of second carbon nanotubes located in the hole. The second carbon nanotubes have a second density. The second density is less than the first density. The base and the electron transmission portions form the TEM micro-grid for observation of a sample using a TEM microscope.

20 Claims, 7 Drawing Sheets

TRANSMISSION ELECTRON MICROSCOPE MICRO-GRID

CROSS-REFERENCE TO RELATED APPLICATIONS

This application claims all benefits accruing under 35 U.S.C. §119 from China Patent Application No. 201010106701.5, filed on Feb. 8, 2010, in the China Intellectual Property Office, the disclosure of which is incorporated herein by reference. This application is related to commonly-assigned applications entitled, "METHOD FOR MANUFACTURING TRANSMISSION ELECTRON MICROSCOPE MICRO-GRID", filed Aug. 2, 2010 application Ser. No. 12/848,328, and "TRANSMISSION ELECTRON MICROSCOPE MICRO-GRID AND METHOD FOR MANUFACTURING THE SAME", filed Aug. 2, 2010 application Ser. No. 12/848,321. Disclosures of the above-identified applications are incorporated herein by reference.

BACKGROUND

1. Technical Field

The present disclosure relates to transmission electron microscope micro-grids, and particularly to a transmission electron microscope micro-grid based on carbon nanotubes.

2. Description of Related Art

In a transmission electron microscope, a porous carbon supporting film (i.e., micro-grid) is used, as an important tool, to carry powder samples and to observe high resolution transmission electron microscope images. With the development of nanotechnology, micro-grids are increasingly coming into widespread use in the field of electron microscopy. The micro-grids used in transmission electron microscopes are usually manufactured using a layer of organic porous membrane covered on a metal mesh net, such as copper mesh net, or nickel mesh net, and subsequently a layer of non-crystal carbon films are deposited thereon via evaporation.

However, the metal mesh nets usually contain impurities such as metal oxide, which can cause an interference in the component analysis of observed samples.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
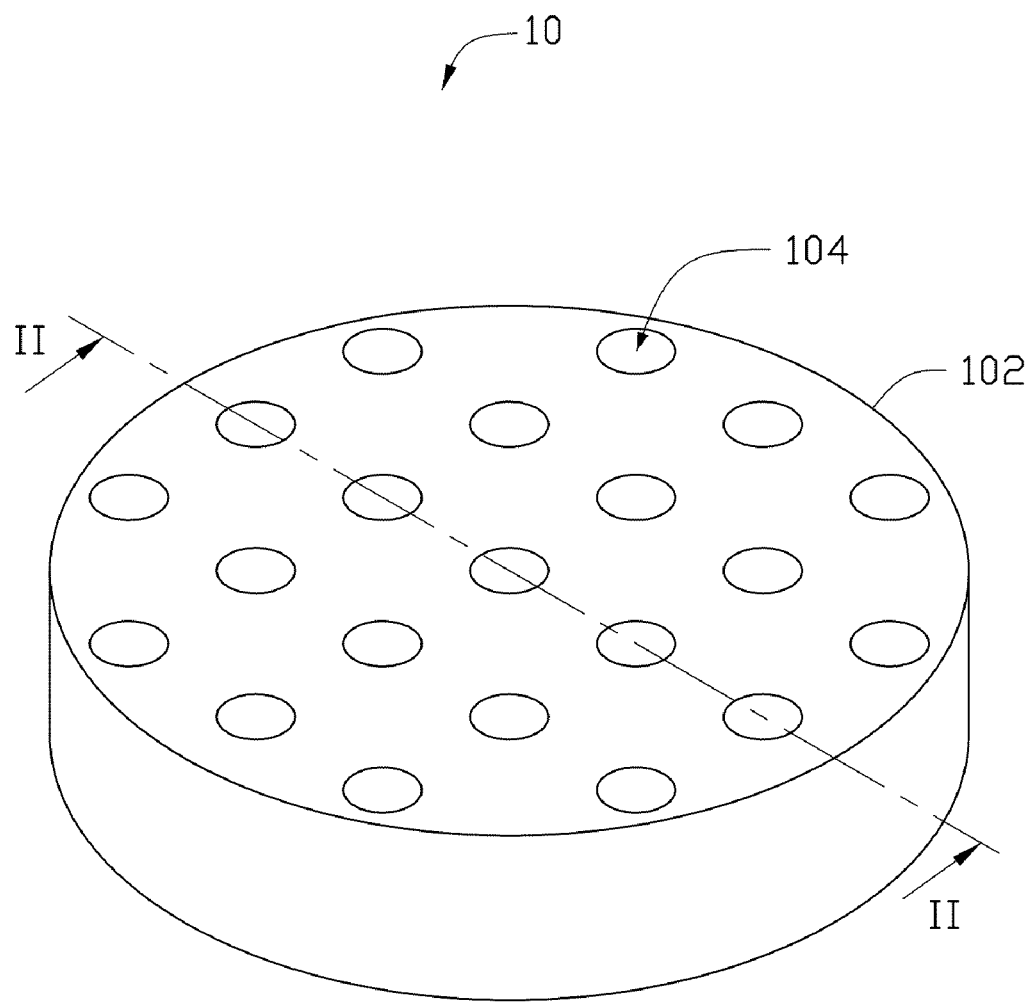
FIG. 1 is a schematic structural view of an embodiment of a transmission electron microscope (TEM) micro-grid.
Figure 2:
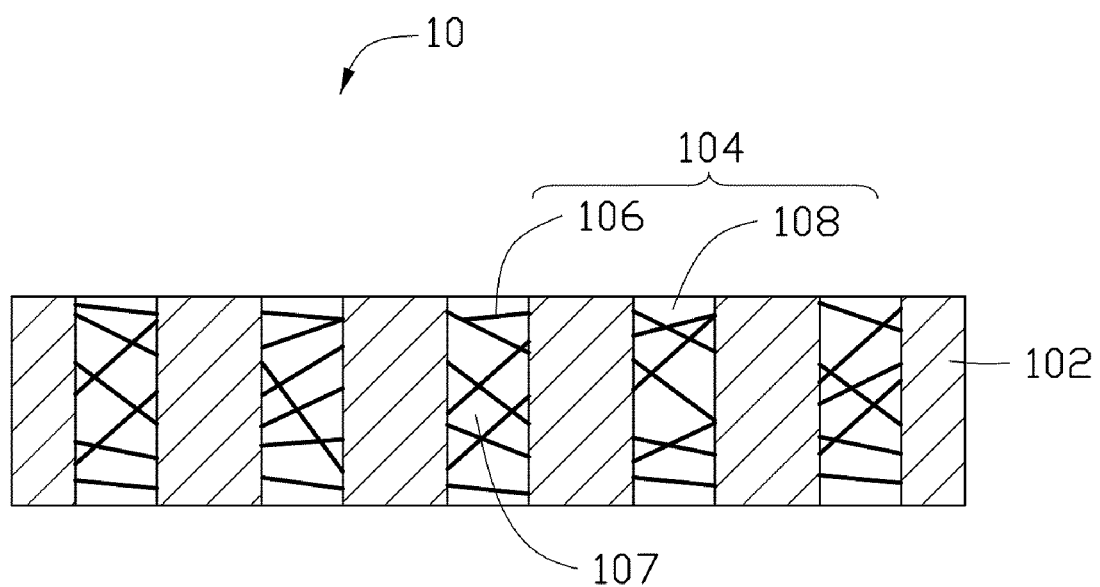
FIG. 2 is a cross-sectional view taken along line II-II of FIG. 1.

Referring to FIG. 1 and FIG. 2, one embodiment of a TEM micro-grid 10 is illustrated. The TEM micro-grid 10 can be a carbon nanotube structure used to carry samples needed to be observed. The TEM micro-grid 10 can be a round sheet of a high-purity carbon nanotube structure having a diameter of about 3 millimeters. The carbon nanotube structure can be a free-standing structure and comprise a plurality of carbon nanotubes. The term "free-standing" includes, but is not limited to, a structure that does not have to be supported by a substrate and can sustain the weight of itself when it is hoisted by a portion thereof without any significant damage to its structural integrity.

The TEM micro-grid 10 comprises a body 102 and a plurality of electron transmission portions 104 distributed in the body 102. The body 102 comprises a plurality of first carbon nanotubes. The electron transmission portions 104 comprise a plurality of second carbon nanotubes 106. The first carbon nanotubes and the second carbon nanotubes 106 together form the carbon nanotube structure.

The body 102 has a first density defined by the first carbon nanotubes. Each of the electron transmission portions 104 has a second density defined by the second carbon nanotubes 106. The second density is less than the first density. The second density can range from about 1/500 to about 1/10 of the first density. In one embodiment, the second density can range from about 1/500 to about 1/10 of the first density.

A plurality of holes 108 is defined in the body 102, and each of the holes 108 has some of the second carbon nanotubes 106 located therein. The holes 108 correspond to the electron transmission portions 104 in a one-to-one manner. In other words, each of the holes 108 with the second carbon nanotubes 106 therein forms one electron transmission portion 104.

The electron transmission portions 104 can be used to carry samples. The electron transmission portions 104 can be formed by irradiating the body 102 with a laser beam. When the laser beam irradiates selected portions of the body 102, some carbon nanotubes in the irradiated portions absorb the laser beam energy, react with the oxygen in the air, and then decompose. Thus, some carbon nanotubes in the irradiated portions will be removed. As a result, the density of the irradiated portions is reduced, forming the electron transmission portions 104. The shape of the holes 108 is not limited, and the holes 108 can be fabricated into many shapes, such as round, elliptical, and square, to adapt to actual needs. The size or diameter of the holes 108 is not limited, and can be adjusted according to actual needs.

In one embodiment, the holes 108 can be round, and have a diameter ranging from about 10 μm to about 200 μm. The electron transmission portions 104 can be uniformly distributed in the body 102. The electron transmission portions 104 can be arranged in an array. The distances between adjacent electron transmission portions 104 can be equal and can be larger than 1 μm.

The second carbon nanotubes 106 in the electron transmission portions 104 can be used to carry samples. The second carbon nanotubes 106 can be integrally formed with the first carbon nanotubes. In one embodiment, the second carbon nanotubes 106 can be supported by inner walls of the holes 108 and suspended in the holes 108. Opposite ends of some of the second carbon nanotubes 106 can be inserted into the inner walls of corresponding holes 108. The second carbon nanotubes 106 can be substantially parallel to or crossed with each other. A plurality of micropores 107 is defined between the second carbon nanotubes 106 as shown in FIG. 2. The size or diameter of the micropores 107 can range from about 1 nm to about 1 μm.

As described above, the TEM micro-grid 10 can be a carbon nanotube structure. Some examples of the carbon nanotube structure will be given below.

The carbon nanotubes structure can include at least one layer of carbon nanotube film. The number of the layers of the carbon nanotube films depends on the thickness of a single layer of carbon nanotube film. The thinner each single layer of carbon nanotube film, the larger the number of the layers of carbon nanotube films. Conversely, the thicker each single layer of carbon nanotube film, the smaller the number of the layers of carbon nanotube films. Adjacent layers of carbon nanotube films can be combined by van der Waals attractive force.

The carbon nanotube film can be a flocculated carbon nanotube film, a pressed carbon nanotube film or a drawn carbon nanotube film.

Flocculated Carbon Nanotube Film

Figure 3:
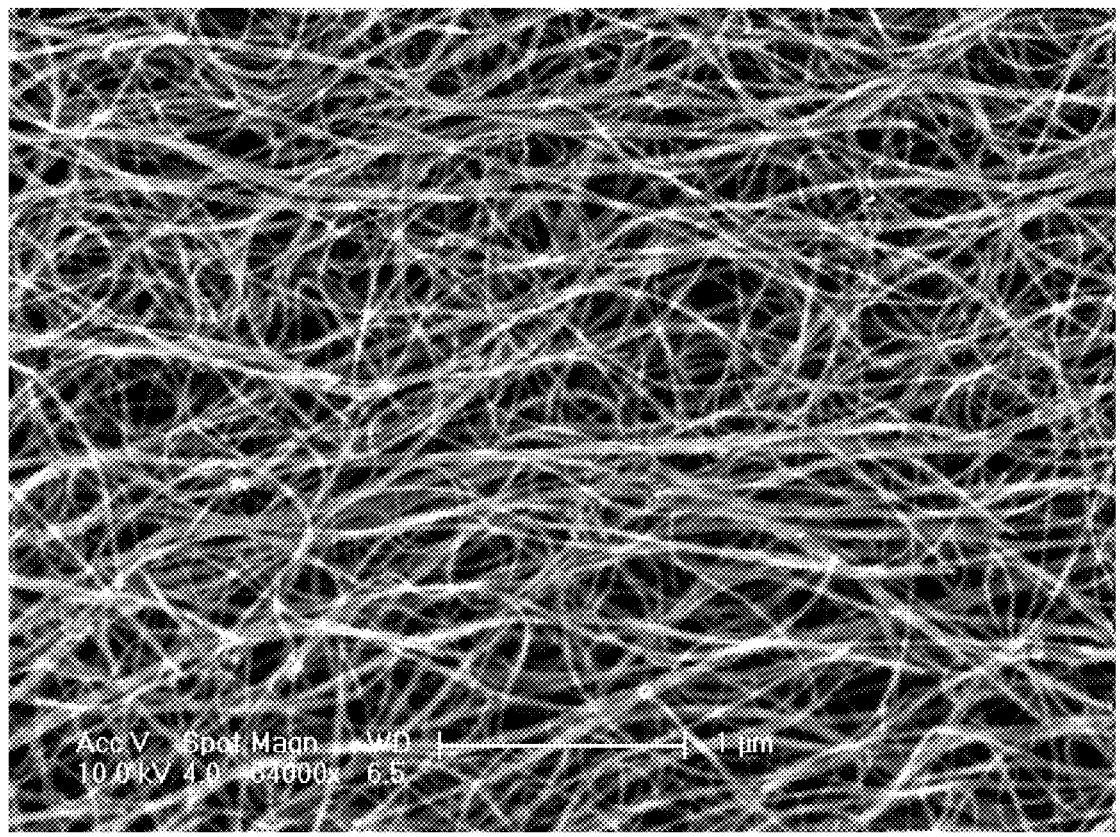
FIG. 3 shows a Scanning Electron Microscope (SEM) image of a flocculated carbon nanotube film.

In some embodiments, the carbon nanotube structure can include a flocculated carbon nanotube film. Referring to FIG. 3, the flocculated carbon nanotube film can include a plurality of long, curved, disordered carbon nanotubes entangled with each other. Further, the flocculated carbon nanotube film can be isotropic. The carbon nanotubes can be substantially uniformly dispersed in the carbon nanotube film. Adjacent carbon nanotubes are acted upon by van der Waals attractive force to obtain an entangled structure with micropores defined therein.

It is understood that the flocculated carbon nanotube film is very porous. The sizes of the micropores can be less than 10 μm. The porous nature of the flocculated carbon nanotube film will increase the specific surface area of the carbon nanotube structure. Because the carbon nanotubes in the carbon nanotube structure are entangled with each other, the carbon nanotube structure employing the flocculated carbon nanotube film has excellent durability, and can be fashioned into desired shapes with a low risk to the integrity of the carbon nanotube structure. The thickness of the flocculated carbon nanotube film can range from about 1 μm to about 2 mm.

It is understood that the carbon nanotube structure can include a single layer of flocculated carbon nanotube film, and the single layer of flocculated carbon nanotube film can provide suitable support by adjusting the thickness thereof.

Pressed Carbon Nanotube Film

Figure 4:
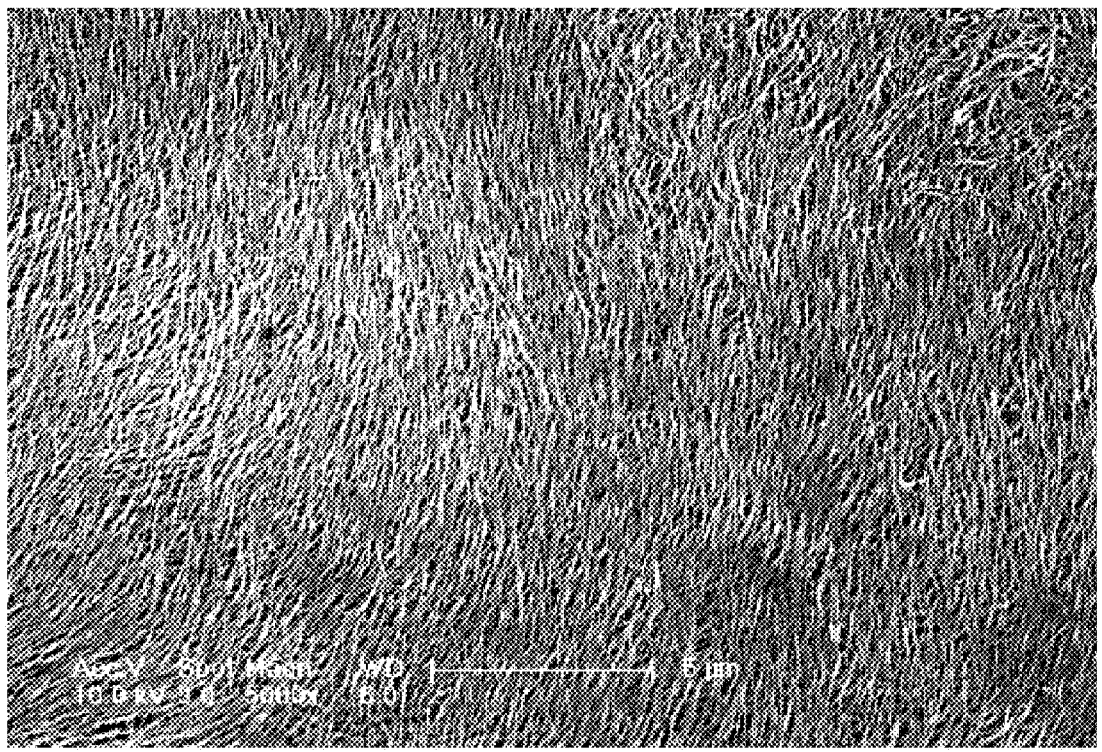
FIG. 4 is an SEM image of a pressed carbon nanotube film.

In other embodiments, the carbon nanotube structure can include at least a pressed carbon nanotube film. Referring to FIG. 4, the pressed carbon nanotube film can be a free-standing carbon nanotube film. The carbon nanotubes in the pressed carbon nanotube film can be arranged along a same direction or along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is about 0 degrees to about 15 degrees. The greater the pressure applied, the smaller the angle obtained. If the carbon nanotubes in the pressed carbon nanotube film are arranged along different directions, the carbon nanotube structure can be isotropic. Here, "isotropic" means the carbon nanotube film has properties identical in all directions substantially parallel to a surface of the carbon nanotube film. The thickness of the pressed carbon nanotube film can range from about 0.5 nm to about 1 mm. Examples of a pressed carbon nanotube film are taught by US PGPub. 20080299031A1 to Liu et al.

It is understood that the carbon nanotube structure can include a single layer of pressed carbon nanotube film, and the single layer of pressed carbon nanotube film can provide suitable support performance by adjusting the thickness thereof.

Drawn Carbon Nanotube Film

Figure 5:
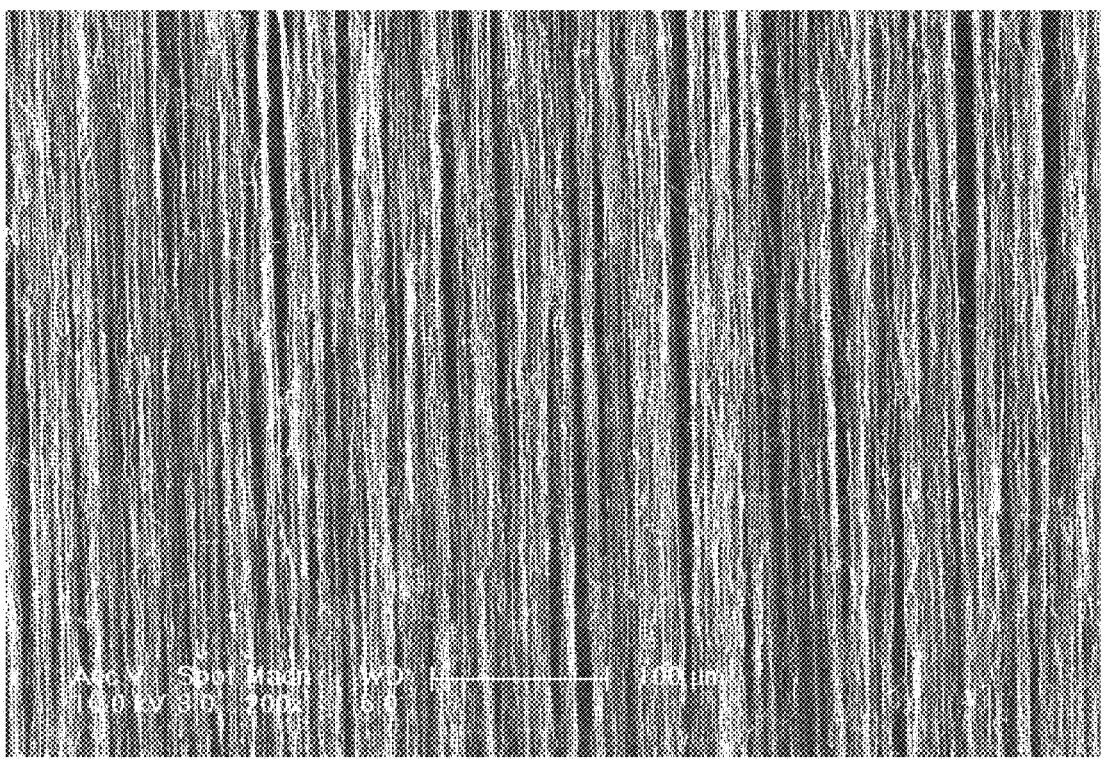
FIG. 5 is an SEM image of a drawn carbon nanotube film.
Figure 6:
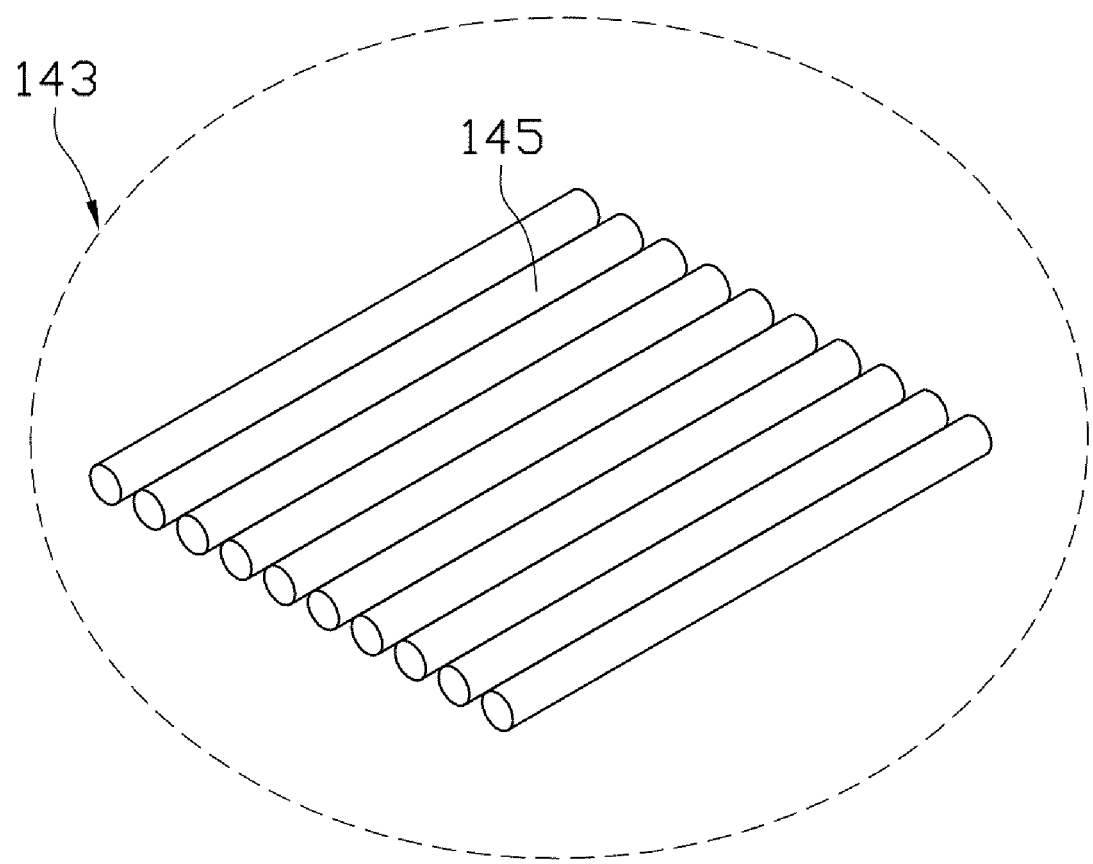
FIG. 6 is a schematic, enlarged view of a carbon nanotube segment in the drawn carbon nanotube film of FIG. 5.

In other embodiments, the carbon nanotube structure can include at least one drawn carbon nanotube film. Examples of a drawn carbon nanotube film are taught by U.S. Pat. No. 7,045,108 to Jiang et al., and WO 2007015710 to Zhang et al. The drawn carbon nanotube film includes a plurality of successive and oriented carbon nanotubes joined end-to-end by van der Waals attractive force therebetween. The carbon nanotubes in the carbon nanotube film can be substantially aligned in a single direction. The drawn carbon nanotube film can be formed by drawing a film from a carbon nanotube array capable of having a film drawn therefrom. Referring to 5 and FIG. 6, each drawn carbon nanotube film includes a plurality of successively oriented carbon nanotube segments 143 joined end-to-end by van der Waals attractive force therebetween. Each carbon nanotube segment 143 includes a plurality of carbon nanotubes 145 substantially parallel to each other, and combined by van der Waals attractive force therebetween. As can be seen in FIG. 5, some variations can occur in the drawn carbon nanotube film. The carbon nanotubes 145 in the drawn carbon nanotube film are also oriented along a preferred orientation.

The carbon nanotube structure can also include at least two stacked drawn carbon nanotube films. In other embodiments, the carbon nanotube structure can include two or more coplanar drawn carbon nanotube films. Coplanar drawn carbon nanotube films can also be stacked upon other coplanar films. Additionally, an angle can exist between the orientation of carbon nanotubes in adjacent drawn films, stacked and/or coplanar. Adjacent drawn carbon nanotube films can be combined by only the van der Waals attractive force therebetween without the need of an additional adhesive. An angle between the aligned directions of the carbon nanotubes in the two adjacent drawn carbon nanotube films can range from about 0 degrees to about 90 degrees. If the angle between the aligned directions of the carbon nanotubes in adjacent drawn carbon nanotube films is larger than 0 degrees, a microporous structure is defined by the carbon nanotubes. The carbon nanotube structure in one embodiment employing these films will have a plurality of micropores. The sizes of the micropores can be less than 10 μm.

In one embodiment, the drawn carbon nanotube film has a thickness ranging from about 0.5 nm to about 100 μm, and the carbon nanotube structure has at least ten layers of drawn carbon nanotube films.

In the embodiment shown in FIG. 2, the carbon nanotube structure has at least 100 layers of drawn carbon nanotube films, an angle between the aligned directions of the carbon nanotubes in the two adjacent drawn carbon nanotube films is about 0 degrees, and the holes 108 have a round shape. The holes 108 each have a diameter ranging from about 30 μm to about 150 μm. The second carbon nanotubes 106 are crossed with each other to define the micropores 107. The micropores 107 each have a size or diameter of about 100 nm. The second density is of about 1/50 of the first density.

As described above, the TEM micro-grid 10 is a sheet of high-purity carbon nanotube structure and does not need mesh nets, thus, the interference caused by metal mesh nets of the typical TEMS in the component analysis of samples can be eliminated or greatly reduced. Therefore, the accuracy and detail of a TEM adopting the TEM micro-grid 10 can be improved.

In application of the TEM micro-grid 10, the sample needed to be observed can be disposed on the TEM micro-grid 10. If the sample has a size larger than the diameter or size of the holes 108, the sample can be placed on the surface of the body 102 and span across at least one of the holes 108. If the sample has a size smaller than the diameter or size of the holes 108, particularly if the sample has a size smaller than about 5 nm, the sample can be disposed in the hole 108 and absorbed on the walls of the second carbon nanotubes 106. Because the TEM micro-grid 10 can be a sheet of high-purity carbon nanotube structure and have few defects, interference of the TEM micro-grid 10 to the morphology and structure of the sample to be observed and the high resolution image of the sample absorbed on the second carbon nanotubes 106 is minimized.

Figure 7:
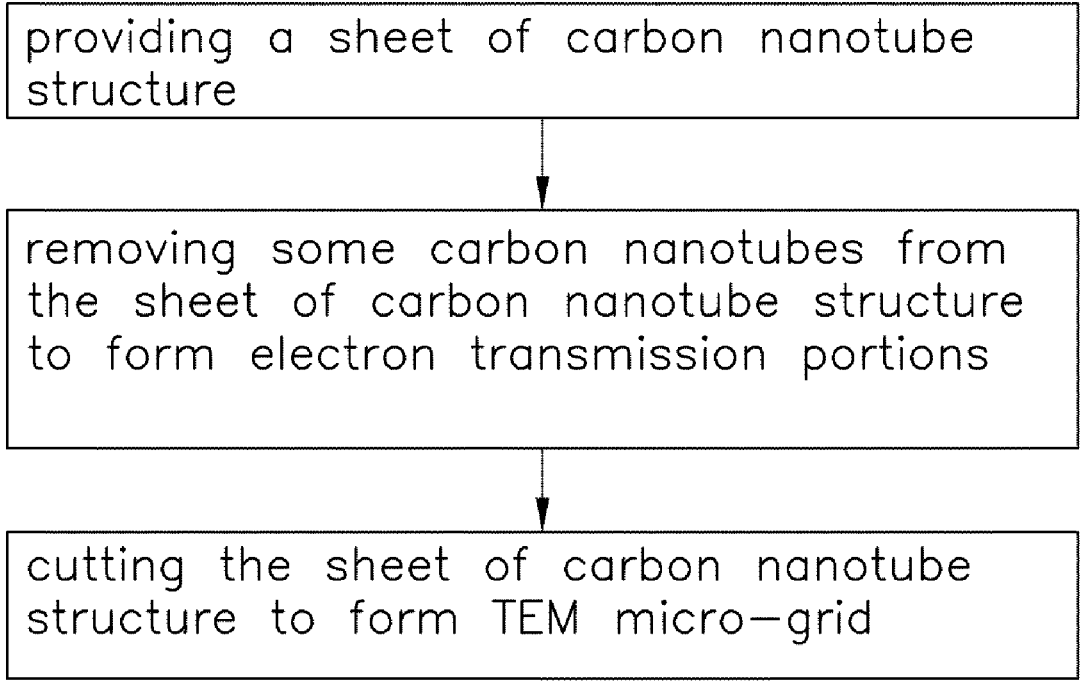
FIG. 7 is a flow chart of an embodiment of a method for making a TEM micro-grid.

Referring to FIG. 7, a method for fabricating the TEM micro-grid 10 includes the steps of:

(a) providing a sheet of carbon nanotube structure;

(b) removing some carbon nanotubes from selected portions of the sheet of carbon nanotube structure to form the electron transmission portions 104; and (c) cutting the sheet of carbon nanotube structure to form the TEM micro-grid 10 in a desired shape.

In step (a), the sheet of carbon nanotube structure includes at least one carbon nanotube film. The at least one carbon nanotube film can be a drawn carbon nanotube film, a pressed carbon nanotube film, or a flocculated carbon nanotube film. In this embodiment, the sheet of carbon nanotube structure includes a plurality of stacked drawn carbon nanotube films. The drawn carbon nanotube films are crossed with each other. The drawn carbon nanotube films can be fabricated by the following steps: (a1) providing an array of carbon nanotubes; and (a2) drawing a carbon nanotube film from the array of carbon nanotubes.

In step (a1), the array of carbon nanotubes can be a super-aligned array of carbon nanotubes. The super-aligned array of carbon nanotubes can be formed by the steps of:

(a11) providing a substantially flat and smooth substrate;

(a12) forming a catalyst layer on the substrate;

(a13) annealing the substrate with the catalyst layer thereon in air at a temperature in a range from about 700° C. to about 900° C. from about 30 to about 90 minutes;

(a14) heating the substrate with the catalyst layer thereon at a temperature in a range from about 500° C. to about 740° C. in a furnace with a protective gas therein; and (a15) supplying a carbon source gas to the furnace for about 5 to about 30 minutes and growing a super-aligned array of carbon nanotubes on the substrate.

In step (a11), the substrate can be a P-type silicon wafer, an N-type silicon wafer, or a silicon wafer with a film of silicon dioxide thereon. In one embodiment, a 4 inch P-type silicon wafer can be used as the substrate. In step (a12), the catalyst can be made of iron, cobalt, nickel, or any alloy thereof. In step (a14), the protective gas can be made up of at least one of nitrogen ($N_2$), ammonia ($NH_3$), and a noble gas. In step (a15), the carbon source gas can be hydrocarbon gas, such as ethylene ($C_2H_4$), methane (CH4), acetylene ($C_2H_2$), ethane ($C_2H_6$), or any combination thereof.

The super-aligned array of carbon nanotubes formed under the above conditions is essentially free of impurities, such as carbonaceous or residual catalyst particles. The carbon nanotubes in the super-aligned array of carbon nanotubes are closely packed together by the van der Waals attractive force. The super-aligned array of carbon nanotubes can have a height of about 200 to about 400 microns and can include a plurality of carbon nanotubes substantially parallel to each other and approximately perpendicular to the substrate.

Step (a2) further includes the sub steps of: (a21) selecting a plurality of carbon nanotube segments having a predetermined width from the super-aligned array of carbon nanotubes; and (a22), pulling the carbon nanotube segments at an even/uniform speed to form the carbon nanotube film.

In step (a21), the carbon nanotube segments having a predetermined width, can be selected by using an adhesive tape as a tool to contact the super-aligned array. In step (a22), the pulling direction is substantially perpendicular to the growing direction of the super-aligned array of carbon nanotubes.

In details, during the pulling process, as the initial carbon nanotube segments are drawn out, other carbon nanotube segments are also drawn out end to end, due to the van der Waals attractive force between the ends of adjacent segments. The carbon nanotube film produced in such manner can be selectively formed having a predetermined width. The carbon nanotube film includes a plurality of carbon nanotube segments. The carbon nanotubes in the carbon nanotube film are mainly parallel to the pulling direction of the carbon nanotube film.

A width of the carbon nanotube film depends on a size of the carbon nanotube array. A length of the carbon nanotube film can be arbitrarily set as desired. In one embodiment, if the substrate is a 4 inch type wafer, a width of the carbon nanotube film is in a range from about 1 centimeter to about 10 centimeters.

The stacked drawn carbon nanotube films can be formed by the steps of: (1) providing a substantially flat base, for example, a ceramic plate; and (2) stacking the drawn carbon nanotube films on the base. An angle between the aligned directions of the carbon nanotubes in the two adjacent drawn carbon nanotube films can range from about 0 degrees to about 90 degrees. Because the carbon nanotubes in the super-aligned array of carbon nanotubes have a high purity and a high specific surface area, the carbon nanotube film is adhesive. As such, the carbon nanotube films can be adhered to the surface of the base directly and a plurality of drawn carbon nanotube films can be adhered to a surface one after another to form a multi-layer carbon nanotube structure. The number of the layers of drawn carbon nanotube films is arbitrary and depends on the actual needs/use. The adjacent layers of the drawn carbon nanotube films are combined by van der Waals attractive force to form a stable multi-layer film.

In step (b), a laser beam is provided to remove some carbon nanotubes from selected portions of the sheet of carbon nanotube structure to form the electron transmission portions 104. The laser beam can be generated by an argon ion laser or carbon dioxide laser. The laser beam has a power of approximately 5 to 30 watts. The power is about 15 watts in one embodiment.

In details, the laser beam can be focused by a lens and irradiate selected portions of the sheet of the carbon nanotube structure point by point and line by line. Some carbon nanotubes in the irradiated portions absorb the laser beam energy, to react with the oxygen in the air and then decompose. Thus, some carbon nanotubes in the irradiated portions will be removed. As a result, the density of the irradiated portions is reduced and the electron transmission portions 104 are formed.

In one embodiment, the sheet of carbon nanotube structure can be fixed, and the laser beam can be moved to irradiate selected portions of the sheet of carbon nanotube structure. In another embodiment, the laser beam can be fixed, and the sheet of the carbon nanotube structure can be moved relative to the laser beam so that selected portions of the sheet of carbon nanotube structure can be irradiated by the laser beam. It is noteworthy that the laser beam can be a pulsed laser beam, and the irradiated portions of the sheet of carbon nanotube structure are spaced from each other.

In step (c), the sheet of carbon nanotube structure with the electron transmission portions 104 distributed therein can be cut into desired pieces and shapes via a laser beam. Similarly, the TEM micro-grid 10 can be formed in any desired shape. In this step, the laser beam can be generated by an argon ion laser or carbon dioxide laser. The laser beam has a power of approximately 5-30 watts. The power is about 18 watts in one embodiment. The laser beam can be controlled to irradiate an outer edge of a TEM micro-grid 10 until the TEM micro-grid 10 is cut off from the sheet of carbon nanotube structure.

Further, the TEM micro-grid 10 can be treated with an organic solvent. The organic solvent can be volatile and selected from the group consisting of ethanol, methanol, acetone, dichloroethane, chloroform, and combination thereof. The TEM micro-grid 10 can be treated by applying the organic solvent to the TEM micro-grid 10, such as dropping the organic solvent from a dropper to soak the entire surface of the TEM micro-grid 10 or immersing the TEM micro-grid 10 into a container having an organic solvent therein.

After being soaked by the organic solvent, two or more neighboring first carbon nanotubes in the base 102 will come closer together. Accordingly, the mechanical properties of the base 102 can be improved. Meanwhile, two or more neighboring second carbon nanotubes 106 in a same hole 108 will bundle together due to the surface tension of the organic solvent.

It is to be understood that the above-described embodiments are intended to illustrate rather than limit the disclosure. Variations may be made to the embodiments without departing from the spirit of the embodiments as claimed. It is understood that any element of any one embodiment is considered to be disclosed to be incorporated with any other embodiment. The above-described embodiments illustrate the scope, but do not restrict the scope of the disclosure.

It is also to be understood that above description and the claims drawn to a method may include some indication in reference to certain steps. However, the indication used is only to be viewed for identification purposes and not as a suggestion as to an order for the steps.

What is claimed is:

1. A transmission electron microscope (TEM) micro-grid comprising:
   a base comprising a plurality of first carbon nanotubes, the first carbon nanotubes having a first density; and
   a plurality of electron transmission portions each comprising a hole defined in the base and a plurality of second carbon nanotubes located in the hole, the second carbon nanotubes having a second density;
   wherein the second density is less than the first density, and the base and the electron transmission portions form the TEM micro-grid for observation of a sample using a TEM microscope.

2. The TEM micro-grid of claim 1, wherein the second density is about $1/900$ to about $1/10$ of the first density.

3. The TEM micro-grid of claim 1, wherein the second density is about $1/500$ to about $1/10$ of the first density.

4. The TEM micro-grid of claim 1, wherein the holes of the plurality of electron transmission portions are arranged in an array.

5. The TEM micro-grid of claim 1, wherein the hole has a diameter of about 10 μm to about 200 μm.

6. The TEM micro-grid of claim 1, wherein the second carbon nanotubes are suspended in the hole.

7. The TEM micro-grid of claim 1, wherein the second carbon nanotubes are substantially parallel to each other.

8. The TEM micro-grid of claim 1, wherein the second carbon nanotubes are crossed with each other and a plurality of micropores is defined between the second carbon nanotubes.

9. The TEM micro-grid of claim 8, wherein the micropores have a size ranging from about 1 nm to about 1 μm.

10. The TEM micro-grid of claim 1, wherein the holes extend through the base.

11. The TEM micro-grid of claim 1, wherein the electron transmission portions are spaced from each other.

12. A transmission electron microscope (TEM) micro-grid comprising:
    a sheet of carbon nanotube structure comprising a plurality of first carbon nanotubes;
    a plurality of holes defined in the sheet of carbon nanotube structure; and
    a plurality of second carbon nanotubes received in each of the holes, the second carbon nanotubes having a smaller density than the first carbon nanotubes.

13. The TEM micro-grid of claim 12, wherein the sheet of carbon nanotube structure has a round shape.

14. The TEM micro-grid of claim 12, wherein the sheet of carbon nanotube structure comprises at least one flocculated carbon nanotube film, at least one pressed carbon nanotube film, or at least one drawn carbon nanotube film.

15. The TEM micro-grid of claim 14, wherein the sheet of carbon nanotube structure comprises at least ten layers of stacked drawn carbon nanotube films.

16. The TEM micro-grid of claim 15, wherein each of the at least ten layers of stacked drawn carbon nanotube films comprises a plurality of carbon nanotubes aligned substantially along a same direction.

17. The TEM micro-grid of claim 16, wherein an angle between aligned directions of the carbon nanotubes in two adjacent drawn carbon nanotube films is larger than 0 degrees.

18. The TEM micro-grid of claim 15, wherein each of the at least ten layers of drawn carbon nanotube films has a thickness ranging from about 0.5 nm to about 100 μm.

19. The TEM micro-grid of claim 12, wherein the holes are spaced from each other.

20. The TEM micro-grid of claim 12, wherein the second carbon nanotubes are crossed with each other, a plurality of micropores is defined between the second carbon nanotubes, and the micropores have a size ranging from about 1 nm to about 1 μm.

* * * * *